(12) United States Patent
Dünser et al.

(10) Patent No.: US 11,784,086 B2
(45) Date of Patent: Oct. 10, 2023

(54) PIN LIFTING DEVICE WITH COUPLING FOR RECEIVING AND RELEASING A SUPPORTING PIN

(71) Applicant: VAT Holding AG, Haag (CH)

(72) Inventors: Daniel Dünser, San Francisco, CA (US); Clemens Kühne, Mels (CH); Michael Dür, Hohenweiler (AT); Rene Bereuter, Pleasanton, CA (US)

(73) Assignee: VAT HOLDING AG, Haag (CH)

( * ) Notice: Subject to any disclaimer, the term of this patent is extended or adjusted under 35 U.S.C. 154(b) by 0 days.

(21) Appl. No.: 17/041,896

(22) PCT Filed: Mar. 27, 2018

(86) PCT No.: PCT/EP2018/057798
§ 371 (c)(1),
(2) Date: Sep. 25, 2020

(87) PCT Pub. No.: WO2019/185124
PCT Pub. Date: Oct. 3, 2019

(65) Prior Publication Data
US 2021/0134651 A1 May 6, 2021

(51) Int. Cl.
*H01L 21/687* (2006.01)
(52) U.S. Cl.
CPC .... *H01L 21/68742* (2013.01); *H01L 21/6875* (2013.01); *H01L 21/68785* (2013.01)
(58) Field of Classification Search
CPC ........... H01L 21/6875; H01L 21/68742; F16B 7/1463; F16B 7/1481; F16B 7/04; F16B 7/025; F16B 7/0406
See application file for complete search history.

(56) References Cited

U.S. PATENT DOCUMENTS 2,784,987 A * 3/1957 Corcoran ............... F16B 7/0413
285/82
3,884,513 A * 5/1975 Gassert ............... F16L 37/0925
285/322

(Continued)

FOREIGN PATENT DOCUMENTS

EP           0885683 A1    12/1998
JP         H11204430 A     7/1999

(Continued)

*Primary Examiner* — Kaitlin S Joerger
(74) *Attorney, Agent, or Firm* — Muncy, Geissler, Olds & Lowe, P.C.

(57) ABSTRACT

Disclosed is a pin lifting device for moving and positioning a substrate. The pin lifting device includes a coupling, a supporting pin configured to support the substrate, and a drive unit which configure to drive the coupling. The pin lifting device includes a separating means for separating a process atmosphere area from an external atmosphere area. The drive unit is at least partially in the external atmosphere area and the coupling is in the process atmosphere area. The coupling includes a linearly extending recess defining a central receiving axis. The recess has a width substantially orthogonally to the receiving axis. A clamping section delimited axially with respect to the receiving axis has a clamping element, in an unloaded receiving state, defines a clamping width that is smaller than the recess width, and the clamping width is variable as a function of a force acting radially on the clamping element.

13 Claims, 5 Drawing Sheets

(56) References Cited

U.S. PATENT DOCUMENTS

| | | | | |
|---|---|---|---|---|
| 4,103,941 A * | 8/1978 | Stoll | ............... | F16L 37/02 |
| | | | | 285/322 |
| 4,902,045 A * | 2/1990 | McGugan | ............. | F16L 37/002 |
| | | | | 285/82 |
| 4,978,150 A * | 12/1990 | Schoot | ............... | F16L 37/084 |
| | | | | 285/317 |
| 5,193,929 A * | 3/1993 | Kahn | ............... | F16B 7/0413 |
| | | | | 403/14 |
| 5,226,680 A * | 7/1993 | Bahner | ............... | F16L 37/122 |
| | | | | 285/423 |
| 5,338,073 A * | 8/1994 | Washizu | ............... | F16L 37/084 |
| | | | | 285/921 |
| 5,848,670 A * | 12/1998 | Salzman | ............... | B66F 7/00 |
| | | | | 414/935 |
| 6,305,677 B1 * | 10/2001 | Lenz | ............... | H01L 21/6831 |
| | | | | 269/21 |
| 6,481,723 B1 | 11/2002 | Hao et al. | | |
| 6,646,857 B2 | 11/2003 | Anderson et al. | | |
| 9,874,299 B2 * | 1/2018 | Stettner | ............... | F16L 37/0927 |
| 2005/0196231 A1 * | 9/2005 | McKay | ............... | F16B 7/04 |
| | | | | 403/364 |
| 2006/0016398 A1 * | 1/2006 | Dubost | ............. | H01L 21/68742 |
| | | | | 118/728 |
| 2007/0193520 A1 * | 8/2007 | Kim | ................. | H01L 21/68742 |
| | | | | 118/729 |
| 2010/0187777 A1 * | 7/2010 | Hao | ................. | H01L 21/68742 |
| | | | | 279/142 |
| 2017/0133260 A1 * | 5/2017 | Pohl | ................. | H01L 21/68742 |
| 2017/0221750 A1 * | 8/2017 | Cotlear | ............. | H01J 37/32715 |
| 2019/0035671 A1 * | 1/2019 | Ha | ................. | H01L 21/68757 |
| 2019/0067076 A1 * | 2/2019 | Zvokelj | ............. | H01L 21/68707 |
| 2020/0075390 A1 * | 3/2020 | Dür | ................. | H01L 21/68742 |
| 2020/0157678 A1 * | 5/2020 | Schaller | ............. | H01L 21/68785 |
| 2021/0137550 A1 * | 5/2021 | Ju | ................. | A61B 17/3205 |
| 2021/0193503 A1 * | 6/2021 | Wagatsuma | ...... | H01L 21/68742 |

FOREIGN PATENT DOCUMENTS

| | | |
|---|---|---|
| JP | 2002-141403 A | 5/2002 |
| JP | 2007-294990 | 11/2007 |
| JP | 2008-112801 | 5/2008 |
| JP | 2008-270721 A | 11/2008 |
| JP | 2015-201593 | 11/2015 |
| KR | 2009-0071751 A | 7/2009 |
| KR | 10-2016-0145881 | 12/2016 |

\* cited by examiner

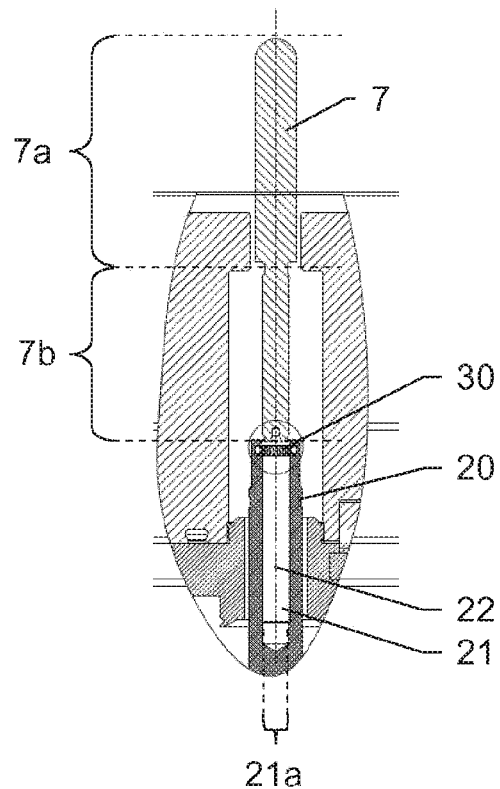
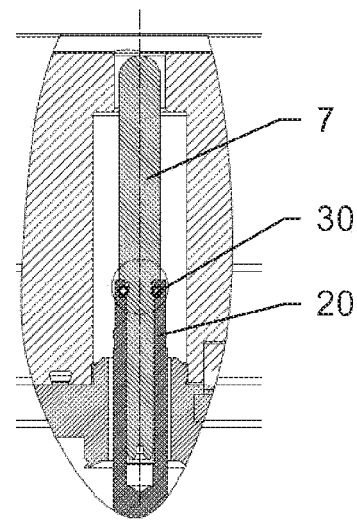
Fig. 3a Fig. 3b
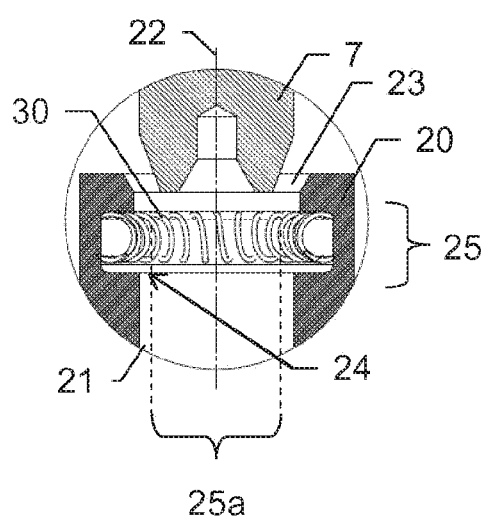
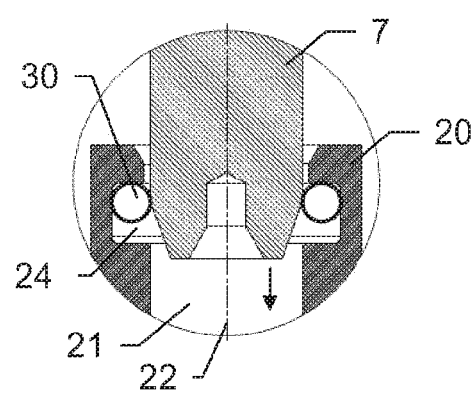
Fig. 4a Fig. 4b

PIN LIFTING DEVICE WITH COUPLING FOR RECEIVING AND RELEASING A SUPPORTING PIN

The present application claims priority to International Application No. PCT/EP2018/057798 filed Mar. 27, 2018 which is herein incorporated by reference in its entirety.

The invention relates to a means for fastening a supporting pin of a pin lifting device for moving and positioning a substrate in a process chamber.

Pin lifting devices, also called pin lifters, are typically designed and intended for receiving and positioning in a defined manner a substrate to be processed in a process chamber. They are used in particular in vacuum chamber systems in the field of IC, semiconductor, flat panel or substrate manufacture, which has to take place in a protected atmosphere as far as possible without the presence of contaminating particles.

Such vacuum chamber systems comprise in particular at least one vacuum chamber which is capable of being evacuated and which is intended to receive semiconductor elements or substrates to be processed or manufactured, said vacuum chamber having at least one vacuum chamber opening, through which the semiconductor elements or other substrates can be guided into and out of the vacuum chamber. For example, in a manufacturing installation for semiconductor wafers or liquid crystal substrates, the highly sensitive semiconductor elements or liquid crystal elements pass sequentially through a plurality of process vacuum chambers, in which the parts located inside the process vacuum chambers are processed by means of a respective processing device.

Such process chambers often have at least one transfer valve, the cross-section of which is adapted to the substrate and robot and through which the substrate can be introduced into the vacuum chamber and possibly removed after the intended processing. Alternatively, a second transfer valve may be provided for example, through which the processed substrate is brought out of the chamber.

The substrate, for example a wafer, is guided for example by an appropriately designed and controlled robot arm, which can be guided through the opening in the process chamber that can be provided with the transfer valve. The loading of the process chamber then takes place by gripping the substrate with the robot arm, bringing the substrate into the process chamber, and depositing the substrate in the chamber in a defined manner. The emptying of the process chamber takes place in a corresponding manner.

For depositing the substrate and for the precise positioning of the substrate in the chamber, a relatively high accuracy and mobility of the substrate must be ensured. To this end, use is made of pin lifting systems which provide a plurality of bearing points for the substrate and thus ensure a load distribution (due to the intrinsic weight of the substrate) over the entire substrate.

The substrate is brought into position above the supporting pins of the lifting device by means of the robot for example, and is lifted by the pins. Once the robot has moved away, the substrate is deposited onto a support, for example a potential plate, by lowering the pins, and the robot arm, which typically carries the substrate, is moved out of the chamber, for example at the same time as the substrate is being deposited. Once the substrate has been deposited, the pins can be lowered further and then are separated therefrom, that is to say there is no contact between the pins and the substrate. Once the robot arm has been removed and the chamber has been closed (and process gas has been introduced or evacuation has taken place), the processing step is carried out.

It is very important to apply a small amount of force to the substrate, in particular even after the process step has been carried out in the chamber and during a subsequent lifting of the substrate, since the substrate may for example adhere to the support. If the substrate is pushed away from the support too quickly, the substrate may break since the adhesion forces, at least at certain bearing points, cannot be overcome or cancelled. In addition, also when contact is being established between the supporting pins and the substrate, an impact that occurs on the substrate may lead to undesired stress (or breakage).

At the same time, besides the gentlest possible handling of the substrates to be processed, the intention is also to enable a processing time that is as short as possible. This means that the substrate can be brought as quickly as possible into the defined states in the chamber, that is to say the loading and unloading position and the processing position.

To avoid unwanted impacts during, for example, the processing of semiconductor wafers, U.S. Pat. No. 6,481,723 B1 proposes the use of a special stop device instead of hard movement stops in a pin lifter. In said document, any hard plastic stops are to be replaced by a combination of a softer stop part and a hard stop, wherein, for limiting the movement, contact is first made with the soft stop part and then the hard stop is brought into contact in a correspondingly damped manner.

U.S. Pat. No. 6,646,857 B2 proposes controlling the lifting movement by means of a detected occurring force. In said document, the supporting pins can be moved as a function of the received force signal, so that the lifting force on the supporting pins always acts on the wafer in a suitably metered and controlled manner.

With each processing cycle, the supporting pins are brought into contact with the substrate to be received and are detached therefrom. This naturally leads to corresponding mechanical stress on the pins. The processing cycles are often relatively close together and require a relatively short processing time. This process implementation can lead to a large number of repetitions within a relatively short period of time. The supporting pins are therefore typically regarded as parts subject to wear and require regular replacement, that is to say they usually have to be replaced after a certain number of cycles or after a certain operating time.

Of course, parts of the components that move with a pin lifting device are arranged in a process volume and are thus also exposed to the effects of a processing procedure, particularly the pins. As a result, these parts may be subject to increased wear and thus also require maintenance and/or have to be replaced regularly or as required.

The maintenance or replacement of such active elements generally requires production procedures to be stopped or interrupted and requires a more or less severe intervention in the overall system. In order to replace a supporting pin, it is often necessary to detach fastening devices for the element in question, which is a complicated procedure. This often leads to relatively long downtimes and requires special tools for the maintenance procedure. In addition, due to the design, fastening means which ensure a fixed arrangement of the active element in the process can often be accessed only with difficulty.

This is also disadvantageous in the event of problems which occur unexpectedly in the system (for example, breakage of a supporting pin), which require rapid intervention at short notice.

It is therefore an object of the present invention to provide an improved vacuum movement device, in which the above disadvantages are reduced or avoided.

Specifically, it is an object of the invention to provide an improved pin lifting device which enables optimized, that is to say in particular quicker and easier, maintenance of the device.

It is also an object of the invention to provide a pin lifting device of correspondingly improved design for the optimized replacement of parts subject to wear.

These objects are achieved by implementing the characterizing features of the independent claims. Features which develop the invention in an alternative or advantageous manner can be found in the dependent claims.

The invention relates to a pin lifting device, in particular a pin lifter, which is designed for moving and positioning a substrate to be processed, in particular a wafer, in a process atmosphere area which can be provided by a vacuum process chamber. The pin lifting device comprises a coupling which is designed to receive a supporting pin which is configured to make contact with and to support the substrate. Also provided is a drive unit which cooperates with the coupling and is designed such that the coupling is movable from a lowered normal position, in which the supporting pin in the loaded state is in a state that has substantially no effect (no contact with the substrate) with regard to the intended effect thereof (for example moving, supporting and positioning a workpiece or substrate), to an extended supporting position, in which the supporting pin in the loaded state provides its intended effect of receiving and/or providing the substrate, and back again, wherein the coupling is movable linearly along a movement axis.

The intended effect of the supporting pin will be understood to be substantially that of receiving, contacting, moving, supporting and/or positioning, etc. a workpiece or substrate. A no-effect state of the supporting pin is to be understood in this context to mean a state in which the pin has no contact (is not yet in contact or is no longer in contact) with a substrate that is intended to be contacted, and in particular for the time being is not providing the intended purpose, that is to say for example is in a lowered waiting position. This is the case in particular while a processing procedure is being carried out on the substrate. However, providing the intended effect does not exclusively mean that there is contact between the supporting pin and the substrate; instead, the pin in this state may be extended and may be held ready to receive a wafer (depositing of the wafer onto the pin). The processes or movements (transporting of the wafer) that subsequently take place once contact is made are to be understood as the providing of the intended effect.

The device additionally comprises a separating means for separating the process atmosphere area from an external atmosphere area, wherein the drive unit is assigned at least partially, in particular entirely, to the external atmosphere area and the coupling is assigned in particular at least partially to the process atmosphere area.

The coupling has for receiving the supporting pin a linearly extending recess which defines a central receiving axis. The recess is in particular of cylindrical shape with a circular base area. In addition, the recess has a recess width that is defined substantially orthogonally to the receiving axis, and a clamping section which is delimited axially with respect to the receiving axis and which has a clamping element, wherein the clamping element, in an unloaded receiving state, that is to say the coupling has not received a supporting pin and is not in contact with such a supporting pin, defines a clamping width that is smaller than the recess width, and the clamping width is variable as a function of a force acting radially on the clamping element.

The unloaded receiving state represents a state in which a supporting pin to be received is not in a retained desired position relative to the coupling. The loaded state is to be understood as a state in which the supporting pin is retained by the coupling in a received desired position.

The clamping element is generally to be understood as an element which provides, with respect to the receiving axis, a width and restoring force that are variable as a function of a magnitude of a force acting radially (orthogonally to the receiving axis). As a result, the clamping element can provide a clamping function for a supporting pin having an external diameter in the region of the internal diameter of the recess.

In particular, the clamping width can be enlarged by means of a force acting in the radially outward direction, wherein a restoring force in the radially inward direction is brought about by the clamping element.

In one embodiment, the clamping section may be a groove in the interior of the recess, said groove in particular running cylindrically around the circumference. In addition, a spring element arranged in the groove forms the clamping element, wherein the spring element in an unloaded receiving state defines a first spring inside width (clamping width), this being smaller than the recess width, and the first spring inside width is variable as a function of a force acting radially on the spring element.

It will be understood that, due to the arrangement of the spring and the geometry of the groove, a force component in the axial direction may also be present when receiving a supporting pin.

In particular, the spring element, in a loaded receiving state in which a supporting pin is retained in the coupling in a desired position, defines in the region of the groove a second spring inside width that is smaller than the recess width. In particular, the second spring inside width may be greater than or equal to the first spring inside width.

A possible retaining of a supporting pin in the recess can be achieved here by means of a restoring force which is provided by the tensioned spring element and which in particular acts radially in the direction of the receiving axis. The spring element may for example engage in a depression running circumferentially around the supporting pin and thus can retain the pin in a defined axial position in the recess. Therefore, when a supporting pin having an external diameter greater than the (first and second) spring width is introduced into the recess, this leads to a (radial) compression of the spring, which is maintained until a spatial radial expansion of the spring is made possible, for example when the spring cooperates with said depression in the supporting pin. Once the spring has expanded (second spring width) in the depression relative to the earlier compression thereof, a certain amount of force is necessary in order to release this connection.

The spring element may be arranged in the groove in a pretensioned manner and may be retained in the groove as a result of the pretensioning.

With regard to the shape, a cross-section through the recess and/or the groove with respect to a plane orthogonal to the receiving axis may be circular or elliptical. It will be understood that alternative cross-sections, for example polygonal cross-sections, are also possible.

In one embodiment, the spring element may be embodied as an annular coil spring, wherein a projection of the spring element onto a plane orthogonal to the receiving axis appears to be in the shape of a ring, in particular in the shape of a circular ring. The ring shape of the coil spring can be achieved by joining the two ends of a linear coil spring. The clamping properties of such a solution can be defined for example by the turn (for example the diameter and/or pitch of the turn), the material thickness, or the type of material.

In particular, a spring diameter defined by a turn of the coil spring may be larger than a radial depression width of the groove. Here, the spring diameter refers in particular to the turn diameter produced by one single turn. The axial width of the groove is in particular larger than the spring diameter, so as to be able to provide an axially defined bearing of the spring in the groove.

An envelope of the spring element may furthermore have the shape of a torus, wherein a toroidal centre line may be elliptical, in particular at least substantially circular. The spring element may therefore have the shape of a circular doughnut or of a compressed (for example oval) doughnut.

With regard to the design of the spring, a turn of the spring element may be canted with respect to a radius of the spring element. In particular, an angle between the toroidal centre line and a centre line of a spring turn may define the cant angle of the turn.

Specifically, the spring element may be designed as a coil spring which is radially tilted in a circular manner.

In a further embodiment, the clamping element may be embodied as an elastically deformable O-ring, wherein a diameter of the material forming the O-ring, in cross-section through a plane that lies in the receiving axis, is larger than a radial depression width of the groove.

In a further embodiment, the clamping element may be designed as an elastomer that is arranged in the groove, in particular as an elastomer vulcanized onto the groove, wherein a radial material thickness of the elastomer is larger than a radial depression width of the groove.

In a further embodiment, the clamping element may be designed as a clamping spring, the provided inside width of which in the unloaded receiving state is smaller than the recess width.

In a further embodiment, the clamping element may be designed as a corrugated leaf spring having an inside width that varies as a function of an angle around the receiving axis, wherein the minimum inside width in the unloaded receiving state is smaller than the recess width.

In a further embodiment, the clamping element may be designed as an axially delimited narrowing of the recess, which is formed integrally with a circumferential wall of the recess, in particular wherein the variability of the clamping width is provided by an at least partial elasticity of the circumferential wall.

The separating means of the pin lifting device may be formed by a housing or a bellows of the drive unit or by a coupling device or the coupling itself.

The drive unit may be designed as a pneumatic drive cylinder.

In one embodiment, the pin lifting device has a control unit for actuating the drive unit, wherein the control unit has a maintenance functionality which is configured such that, when this is implemented, the axial position of the coupling can be varied in order to provide a changeover state, for example is moved to an enhanced extended state.

The devices according to the invention will be described in greater detail below purely by way of example and with reference to specific exemplary embodiments shown schematically in the drawings, wherein further advantages of the invention will also be discussed. In the drawings.

Figure 5:
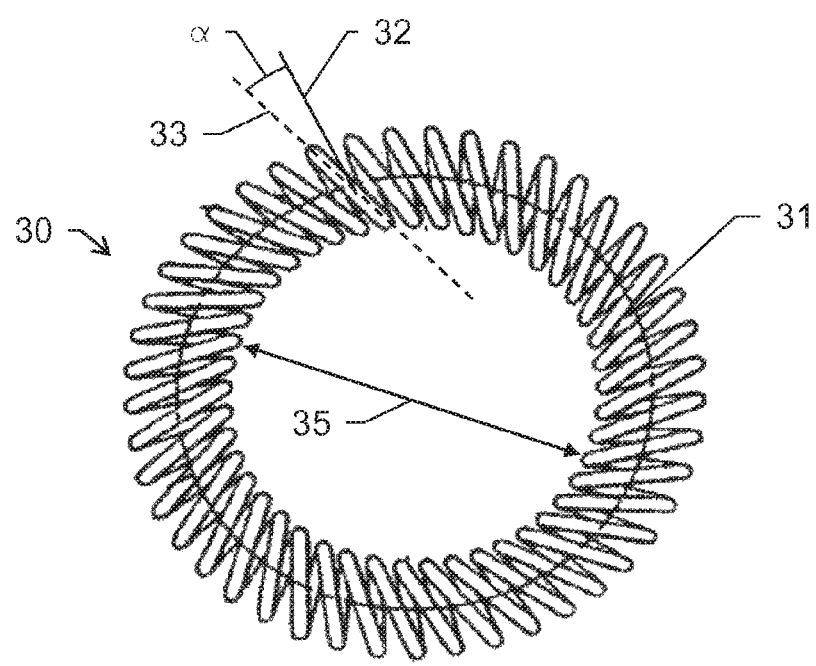

FIGS. 3a-b show an embodiment of a coupling of a pin lifting device according to the invention, with a supporting pin in different states;

FIGS. 4a-e show an enlarged diagram of a coupling according to the invention, in different receiving states;

FIG. 5 shows a canted coil spring provided in one embodiment of the coupling according to the invention; and FIGS. 6a-d show different embodiments of couplings of pin lifting devices according to the invention.

Figure 1:
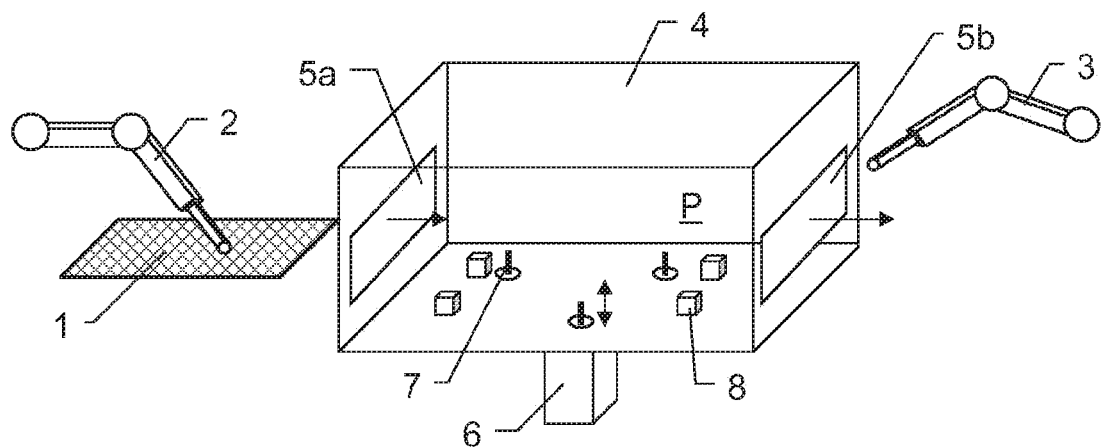
FIG. 1 shows a schematic diagram of an embodiment of a vacuum processing device for a wafer, with a lifting device according to the invention.

FIG. 1 schematically shows a process set-up for processing a semiconductor wafer 1 under vacuum conditions. The wafer 1 is introduced into a vacuum chamber 4 (process atmosphere area P) through a first vacuum transfer valve 5a by means of a first robot arm 2 and is brought into position via supporting pins 7 of a pin lifting device (here: three pins shown). The wafer 1 is then lifted by means of the pins 7, and the robot arm 2 is moved away. The wafer 1 typically bears—as shown—against the robot arm or against a supporting device provided on the robot arm 2, 3. After the wafer 1 has been lifted by the pins 7, the robot arm is guided out of the chamber 4, the transfer valve 5a is closed, and the pins 7 are lowered. This takes place by means of a drive cylinder or lifting cylinder 6, which is coupled to the three pins 7 and thus moves the pins 7 jointly. The wafer 1 is thus deposited on the four supporting elements 8 shown. The drive cylinder or lifting cylinder 6 forms, together with the respective couplings which are designed to receive the supporting pins 7, the pin lifting device according to the invention. The structure and function in particular of such a coupling is described in detail by the subsequent figures.

In this state, a planned processing (for example coating) of the wafer 7 takes place under vacuum conditions and in particular in a defined atmosphere (that is to say using a particular process gas and under a defined pressure). To this end, the chamber 4 is coupled (not shown) to a vacuum pump and preferably to a vacuum control valve for controlling the chamber pressure.

After the processing, the wafer 1 is lifted into a removal position, once again by means of the pin lifting device. The wafer 1 is then removed through the second transfer valve 5b by the second robot arm 3. Alternatively, the process may be designed with just one robot arm, wherein the loading and removal can then take place through a single transfer valve.

Figure 2:
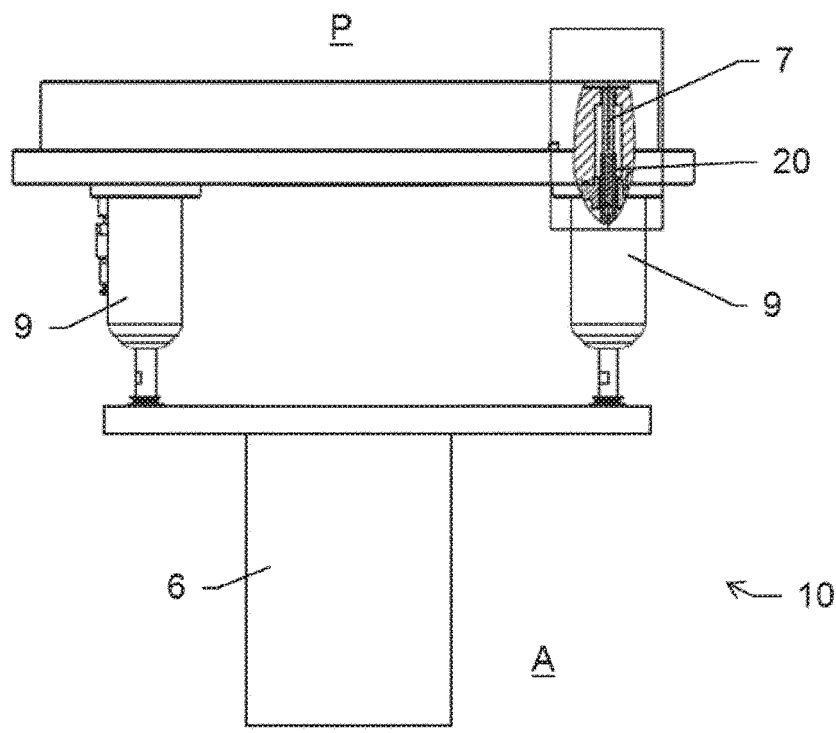
FIG. 2 shows an embodiment of a pin lifting device according to the invention, in a side view.

FIG. 2 shows a pin lifting device 10 according to the invention, in a side view. The pin lifting device 10 has a drive unit 6, which is once again connected to respective supporting pins 7 by means of suitable couplings 20 (for perspective reasons, only two such coupling arrangements 9 are visible in FIG. 2).

In this embodiment, the coupling arrangements 9 each have a separating means for separating a process atmosphere area P from an external atmosphere area A. Such a separating means may be provided for example in the form of a bellows in the interior of the coupling arrangements 9, wherein the bellows is connected for example to a guide rod. The bellows enables an axial movement of the guide rod in the arrangement 9, while at the same time separating the two areas P and A in an air-tight manner. The coupling 20 attached to the guide rod is located in the process atmosphere area P.

FIGS. 3a and 3b illustrate the cooperation of a supporting pin 7 with a coupling 20, for example in a coupling arrangement 9 of FIG. 2. It will be understood that the invention is not limited to the arrangement of the coupling 20 and the supporting pin 7 in the coupling arrangements 9, but rather the coupling 20 and in particular the supporting pin 7 can be provided independently of a coupling arrangement 9.

FIG. 3a shows the coupling 20 in an unloaded state, that is to say the supporting pin 7 is separate from the coupling 20 and is not received by the latter. The supporting pin 7 here is an axially extending body which is round in cross-section and which has an upper supporting region 7a and a lower coupling region 7b. At the transition between the upper supporting region 7a and the lower coupling region 7b, the supporting pin 7 has a depression, the external diameter of which is smaller than the diameter of the adjoining coupling region 7b. The depression is provided for the engagement of a retaining element (clamping element) in a coupled state, so as to provide a releasable coupling of the supporting pin 7 to the drive unit by means of the coupling 20. It will be understood that the supporting pin may alternatively have, at least over parts of its axial extension, a non-round cross-section, for example a polygonal or elliptical cross-section.

The coupling 20 has a recess 21, which defines a receiving axis 22 along an extension of the recess 21. The recess 21 additionally has, at least over the most part, a defined width 21a. In the illustrated example, the recess 21 is in the shape of a cylinder with a circular base area. The width 21a thus corresponds to a diameter of the recess 21. In alternative embodiments, the recess 21 may have a non-circular cross-section, and the width 21a corresponds to a distance between two opposite points on the surface of the recess.

FIG. 3b shows the coupling 20 in a loaded state, in which the coupling region 7b of the supporting pin 7 is received in the coupling 20 and a retaining element in the form of a spring element 30 cooperates with the depression of the supporting pin 7 and the supporting pin 7 is thus retained in the coupling 20.

The spring element 30 is mounted in a groove of the recess 21. The groove has a width (here: diameter) which, with respect to the receiving axis 22, is larger than the recess 21. A detailed view and description of this can be found in the subsequent figures.

FIGS. 4a-e show a coupling mechanism of a pin lifting device according to the invention, in an enlarged view and in different states.

FIG. 4a shows an end of the coupling 20 in an unloaded state, wherein a lower free end of the supporting pin 7 or of the coupling region 7b is arranged in the region of an opening 23 of the recess 21, without making contact therewith.

The recess 21 of the coupling 20 additionally has a groove 24 within an axial clamping region or spring region 25. The groove 24 provides an enlarged width in comparison to the rest of the recess 21, in a region that is delimited axially (with respect to the receiving axis 22). If both the recess 21 and the groove 24 have a round, in particular circular, cross-section, as is the case here, then the groove 24 defines a diameter that is larger than the internal diameter of the recess 21.

The groove 24 additionally enables the receiving and axial bearing of a spring element 30 in the depression formed by the groove 24, said spring element embodying a clamping element. The spring element 30 is configured as an annular coil spring and lies in the groove 24. It is in principle a linear coil spring, the ends of which are joined. The turn of the spring 30 is configured such that an axial spring diameter defined by the turn is smaller than an axial width of the groove 24, but a radial spring diameter is larger than a radial depth of the groove 24. To this end, the groove 24 can have a radial depth that is smaller than an axial width of the groove 24. In this state, therefore, the spring 30 defines an internal diameter (clamping width 25a) that is smaller than the internal diameter of large parts of the recess 21.

In one specific embodiment, the spring 30 may have a canted turn. Here, a centre line of a turn encloses an angle α with a (toroidal) centre line 31 of a torus defined by the spring. This angle α indicates the cant angle of the turn. In other words, a plane 33 defined by a turn intersects an orthogonal 32 to the toroidal centre line at the point where the plane 33 intersects the centre line 31 at this angle α. FIG. 5 shows by way of example an embodiment of such a canted spring 30 having a spring inside width 35.

The canted spring 30 may be designed for example for latching and retaining in coil diameters of at least 0.5 mm. It may be formed in many materials and surface finishes, for example from stainless steel and nickel-based alloys. The spring 30 may in particular be designed such that permanent locking or a defined retaining function is provided under application of a particular tensile force between the coupling and the supporting pin.

The canted spring 30 can therefore be used to connect two components to one another in a releasable manner according to a predefined force requirement (latching spring application). The spring 30 may additionally have a high compression set resistance. The spring 30 can additionally connect two parts with a minimum force requirement. As a result, further tools may be superfluous.

According to the invention, a retaining function of the spring 30 can be combined with a latching function. The spring 30 can in this case slide over a surface (surface of the supporting pin 7) until a latching point (narrowing of the supporting pin surface 7c) is reached. Such a procedure is shown by the figures described below. The tensile force and the insertion and removal force of the spring can be set accordingly.

By way of example, a spring manufactured from a nickel-based alloy as a wire material having a wire diameter of approximately 0.8 mm, the spring having a turn diameter of approximately 25 mm, may have an initial separating force of at least 900 kg and still of at least 770 kg after a number of (for example five) changeover cycles. It will be understood that the spring 30 can be configured with correspondingly lower separating force requirements for use in a pin lifting device according to the invention, so that release of the supporting pin 7 from the coupling 20 remains practical and easy and can be carried out by one person.

FIG. 4b shows the supporting pin 7 in a progressed receiving position, that is to say the supporting pin has been pushed somewhat further into the recess 21 in comparison to FIG. 4a. The spring 30 is compressed or tensioned to a greater extent due to the suitably selected external diameter of the lower part of the supporting pin 7 (coupling region). The external diameter of the pin 7 substantially corresponds to the internal diameter of the recess 21. As a result, a corresponding spring force of the spring acts on the surface of the supporting pin 7. Since the spring 30 in the illustrated example is arranged in a radially circumferential manner in the groove 24, the spring force also acts radially from circumferential directions.

Figure 4C:
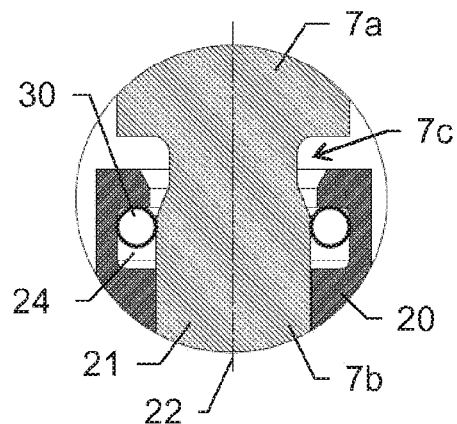

FIG. 4c shows the pin 7 pushed further into the coupling 20. The spring 30 is still in a compressed state. Provided in the transition region between an upper supporting region 7a and a lower coupling region 7b of the supporting pin 7 is a depression or tapering 7c, the external diameter of which is smaller than the diameter of the coupling region 7b adjoining it in the downward direction.

Figure 4D:
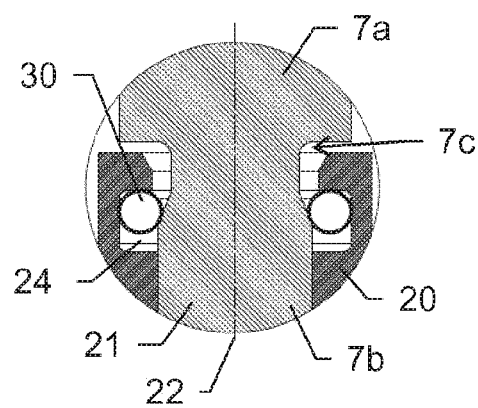

FIG. 4d shows a cooperation of the compressed spring 30 with a bevelled transition of the coupling region 7b at the tapering 7c. Due to the sloping pin surface in this region, the spring 30 exerts an axial tensile force on the pin 7 in the direction of the recess, in addition to the radially acting restoring force.

Figure 4E:
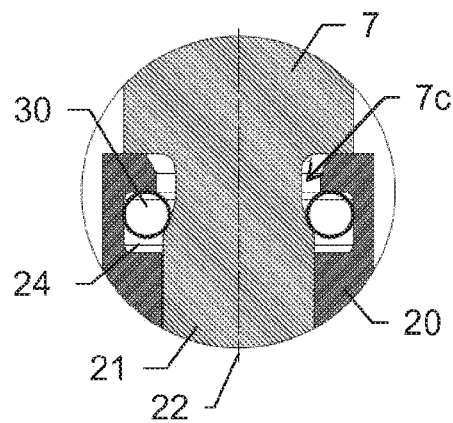

FIG. 4e shows the coupling 20 in a loaded state, that is to say the supporting pin 7 has been introduced to the maximum extent into the recess 21 as far as a supporting pin stop (desired position). In this state, the spring 30 is still compressed in comparison to FIG. 4a but at the same time has expanded further in contrast to FIG. 4d, such that the force exerted by the spring 30 in the axial direction means a retaining force for the supporting pin 7.

The supporting pin 7 is therefore in a releasable retaining position. In order to release the supporting pin 7 from this retaining position, it is necessary to apply an increased amount of force due to the bevelled transition of the depression 7c. As a result, this means that the supporting pin 7 can be introduced into the coupling 20 with a first force which is smaller than a second force that is required in order to release the pin 7. The first force is determined by the severity of the bevelling of the surfaces at the lower free end of the pin 7. The supporting pin 7 is additionally thus retained with at least a retaining force that is necessary for typical processing procedures.

The effective retaining force can be set by a specific design of the spring element 30. When using a toroidal coil spring, the force can be defined for example by the type and strength of the spring material, by a turn density and/or cant angle, or by the spring diameter.

The retaining force is determined in particular as a function of retaining forces which possibly occur between the supporting pin and a supported substrate during a deposition process. Increased retaining forces may result from the occurrence of local vacuum situations.

By virtue of the above-described cooperation of the coupling 20, the spring 30 and the design of the supporting pin 7, a releasable retaining and changeover system of a pin lifter is thus provided for a supporting pin 7.

A pin lifting device according to the invention, comprising a spring element in a coupling as described, thus offers the advantage that a supporting pin 7 can be replaced relatively easily and quickly. To this end, in contrast to the prior art, no additional mechanical releasing of retaining or clamping devices is required, and thus no additional special tool is required. The supporting pin can simply be pulled out of the coupling and introduced into the latter. Such maintenance no longer requires specifically trained personnel. Another advantage is the resulting avoidance of, or at least reduction in, particle formation when changing a supporting pin.

FIGS. 6a-d show further embodiments of a coupling/supporting pin combination of a pin lifting device according to the invention. The embodiments each show a coupling 20 with a supporting pin 7 in the loaded state, but differ by the respective design of the clamping region 25 or of the clamping element. It will be understood that the respective clamping elements may be designed to run radially around the entire circumference and/or in a circular manner, or may be present only partially with respect to the inner cylindrical surface or only partially in the groove 24.

Figure 6A:
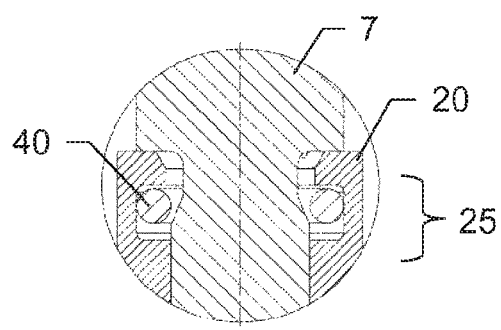

FIG. 6a shows an embodiment according to the invention with an elastic O-ring 40 as the clamping element.

Figure 6B:
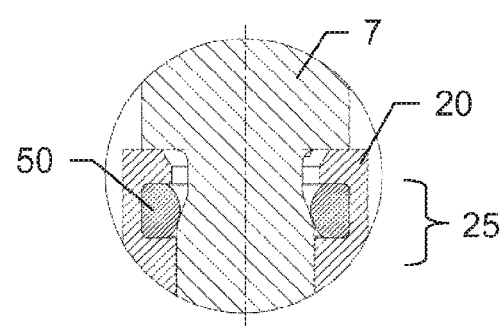

FIG. 6b shows a solution according to the invention with an elastomeric material 50 provided in the groove 24. The elastomer 50 is elastically deformable and may in particular be vulcanized into the groove 24.

Figure 6C:
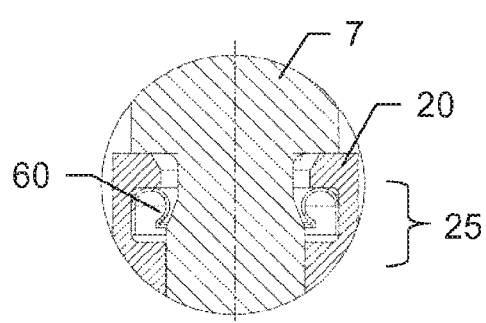

FIG. 6c shows an embodiment according to the invention with a tensioned clamping spring 60 which provides a radial restoring force.

Figure 6D:
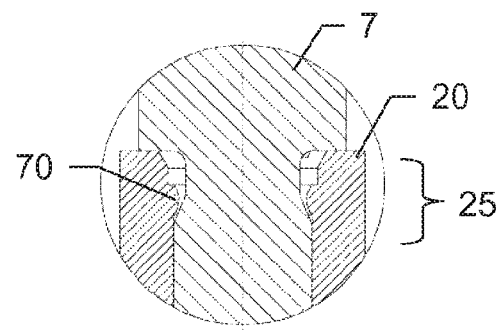

FIG. 6d shows a solution according to the invention with a clamping protrusion 70 provided in the clamping region 25, which provides a corresponding narrowing of the recess width. The clamping protrusion 70 is preferably formed integrally with the recess 21 or with the coupling wall. A variation of the narrowing is achieved here by means of a corresponding elasticity of the coupling wall, that is to say that an elastic flexing of the wall enclosing the recess 21 takes place when a radially outwardly acting force is applied to the clamping protrusion 70.

It will be understood that the illustrated figures merely provide a schematic representation of possible exemplary embodiments. According to the invention, the various approaches can also be combined with one another and also with prior art devices for processing substrates in vacuum process chambers, in particular pin lifters.

The invention claimed is:

1. A pin lifting device designed for moving and positioning a substrate to be processed, in a process atmosphere area which can be provided by a vacuum process chamber, said pin lifting device comprising:
   a coupling designed to receive a supporting pin configured to make contact with and to support the substrate;
   a drive unit which cooperates with the coupling and is designed such that the coupling is movable from
      a lowered normal position, in which the supporting pin in a loaded state is in a state that has substantially no effect with regard to an intended effect of receiving and/or providing the substrate, to
      an extended supporting position, in which the supporting pin in the loaded state provides the intended effect of receiving and/or providing the substrate,
      and back again, wherein the coupling is movable linearly along a movement axis; and
   a separating means for separating the process atmosphere area from an external atmosphere area, wherein the drive unit is assigned at least partially to the external atmosphere area and the coupling is assigned in particular to the process atmosphere area,
   wherein the coupling has a cylindrical, linearly-extending recess for receiving the supporting pin, wherein the recess defines a central receiving axis, and said recess having a recess width that is defined substantially orthogonally to the receiving axis,
   wherein the coupling has a clamping section which is delimited axially with respect to the receiving axis and which has a clamping element,
   wherein the clamping element, in an unloaded receiving state, defines a clamping width that is smaller than the recess width, and the clamping width is variable as a function of a force acting radially on the clamping element,
   wherein the coupling has in a region of the clamping section a groove in an interior of the recess, said groove running cylindrically around a circumference, and a spring element that is rotational symmetric is arranged in the groove as the clamping element, wherein the spring element in an unloaded receiving state defines a first spring inside width as the clamping width that is smaller than the recess width, and the first spring inside width is variable as a function of a force acting radially on the spring element, and wherein an envelope of the spring element has a shape of a torus, wherein a toroidal center line is elliptical.

2. The pin lifting device according to claim 1, wherein the spring element is an annular coil spring.

3. The pin lifting device according to claim 1, wherein the spring element, in the loaded state in which the supporting pin is retained in the coupling in a desired position, defines in the region of the groove a second spring inside width that is smaller than the recess width.

4. The pin lifting device according to claim 1, wherein the spring element is arranged in the groove in a pretensioned manner and is retained in the groove as a result of the pretensioning.

5. The pin lifting device according to claim 1, wherein a cross-section through the recess and/or the groove with respect to a plane orthogonal to the receiving axis is circular.

6. The pin lifting device according to claim 1, wherein the spring element is an annular coil spring, wherein a projection of the spring element onto a plane orthogonal to the receiving axis is in a shape of a ring.

7. The pin lifting device according to claim 6, wherein a spring diameter defined by a turn of the coil spring is larger than a radial depression width of the groove.

8. The pin lifting device according to claim 1, wherein the toroidal center line is circular.

9. The pin lifting device according to claim 1, wherein a turn of the spring element is canted with respect to a radius of the spring element, wherein an angle between the toroidal center line and a center line of a spring turn defines a cant angle of the turn.

10. The pin lifting device according to claim 1, wherein the spring element is designed as a coil spring which is radially tilted in a circular manner.

11. The pin lifting device according to claim 1, wherein the clamping element is configured to retain the supporting pin in the coupling in the loaded state.

12. A pin lifting device designed for moving and positioning a substrate to be processed, in a process atmosphere area (P) which can be provided by a vacuum process chamber, said pin lifting device comprising:
- a coupling configured to receive and retain a supporting pin in a loaded state and not to receive the supporting pin in an unloaded receiving state;
- a drive unit which cooperates with the coupling and is designed such that the coupling is movable between
  - a lowered normal position, in which the supporting pin in the loaded state is in a state that has substantially no effect with regard to an intended effect of receiving and/or providing the substrate, and
  - an extended supporting position, in which the supporting pin in the loaded state provides the intended effect of receiving and/or providing the substrate,
  - wherein the coupling is movable linearly along a movement axis; and
- a separating means for separating the process atmosphere area from an external atmosphere area,
- wherein the coupling has a cylindrical, linearly-extending recess for receiving the supporting pin, wherein the recess defines a central receiving axis, and said recess having a recess width that is defined substantially orthogonally to the receiving axis,
- wherein the coupling has a clamping section which is delimited axially with respect to the receiving axis and which has a clamping element,
- wherein the clamping element is an annular coil spring, and
- wherein the clamping element, in the unloaded receiving state, defines a clamping width that is smaller than the recess width, and the clamping width is variable as a function of a force acting radially on the clamping element.

13. The pin lifting device according to claim 12, wherein the clamping element is configured to retain the supporting pin in the coupling in the loaded state.

* * * * *